Aug. 8, 1967 TAKAHIKO KASUGAI ETAL 3,335,337

NEGATIVE RESISTANCE SEMICONDUCTOR DEVICES

Filed May 21, 1963

INVENTORS
Takahiko Kasugai
Susumu Nojima
BY
George B. Oujevolk
Attorney

United States Patent Office 3,335,337

Patented Aug. 8, 1967

3,335,337

NEGATIVE RESISTANCE SEMICONDUCTOR DEVICES

Takahiko Kasugai, Kawasaki-shi, and Susumu Nojima, Tokyo, Japan, assignors to Anritsu Electronic Works, Ltd., Tokyo, Japan, a corporation of Japan Filed Mar. 21, 1963, Ser. No. 266,858
Claims priority, application Japan, Mar. 31, 1962, 37/12,985
7 Claims. (Cl. 317—234)

This invention relates to negative resistance semiconductor devices of the junction type diode containing deep level impurities in their intermediate layers.

Heretofore four layered diodes, avalanche diodes, Ezaki or tunnel diodes and the like have been developed as semiconductor diodes having a negative resistance characteristic.

Generally speaking, the negative resistance semiconductor device of this invention includes a pair of spaced $N^+$ type and $P^+$ type semiconductor layers and an intermediate layer of the P type or N type semiconductor interposed between said semiconductor layers. One or both of the regions of the intermediate layer adjacent to said $N^+$ or $P^+$ or both $N^+$ and $P^+$ semiconductor layers are doped with deep level impurities and the concentration of said impurity in said region or regions is gradually decreased or graded toward the central portion of said intermediate layer. By controlling the width of said region containing the impurity, the point of transition from positive to negative resistance characteristic or vice versa can be easily varied. Moreover use of deep level impurities contributes in decreasing the switching time of the semiconductor device of this invention.

The features of the invention which are believed to be novel are specifically set forth in the claims attached hereto. The invention will, however, be best understood and further advantages thereof appreciated from a consideration of the following description and the accompanying drawing, in which:

Figure 1:
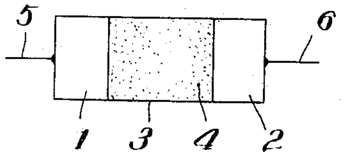
FIG. 1 is a schematic representation of one embodiment of this invention.

Referrring now to the accompanying drawing in which FIG. 1 shows one example of the negative resistance semiconductor device of the $P^+NN^+$ type constructed in accordance with the principle of this invention. More particularly, this semiconductor device comprises a $P^+$ type semiconductor layer 1, an $N^+$ type semiconductor layer 2 and an intermediate layer 3 of the N type which constitute the junction between said layers. This intermediate layer adjacent to the $N^+$ type semiconductor layer 2 contains deep level impurities 4 with such a concentration gradient that the concentration becomes higher near the $N^+$ type semiconductor layer 2. As the deep level impurities 4 may be used gold, copper, iron, zinc, nickel, when silicon is used as the semiconductor whereas gold, iron, copper, nickel, cobalt, are effective when germanium is utilized as the semiconductor. Semiconductor layers 1 and 2 are provided with terminal leads 5 and 6, respectively.

Figure 2:
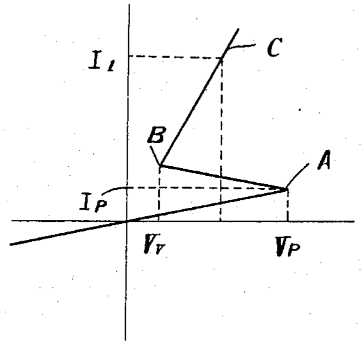
FIG. 2 shows the voltage-current characteristic curve of the device shown in FIG. 1.

The above-described semiconductor device in accordance with this invention can provide a voltage-current characteristic curve as shown in FIG. 2. As will be clearly noted from this figure this device exhibits the negative resistance characteristics between the points A and B. In FIG. 2, $V_p$ and $I_p$ represent the magnitude of the voltage and current, respectively, at the point A while $V_v$ represents the magnitude of the voltage at the point B. It is possible to manufacture semiconductor devices to have the voltage $V_p$ on this characteristic curve of any value in a very wide range from 0.5 volt to several hundred volts, and the value of the voltage $V_v$ may be made to be of relatively small value of about 0.4 volt to 1.5 volts. Moreover it is possible to pass the current $I_1$ of about 300 miliamperes when the voltage $V_1$ is about 1.5 volts at a point of the portion of the characteristic curve which is similar to the conventional diode characteristic curve, in other words, the portion of the curve between the points B and C. From FIG. 2, it will be easily understood that the reverse characteristic of the semiconductor devices of this invention is substantially equal to that of the conventional PN junction type diodes.

Figure 3:
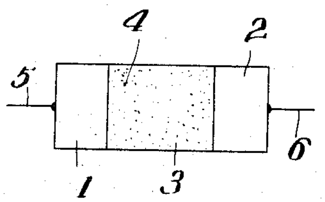
FIGS. 3 to 7 inclusive illustrate various other modifications of this invention.
Figure 4:
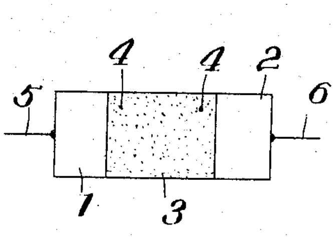

FIG. 3 illustrates a modification of this invention comprising a $P^+$ type semiconductor layer 1, and N type semiconductor layer 2 and an $N^+$ type intermediate layer 3 wherein the gradient of the concentration of the deep level impurities 4 in the region adjacent to the $P^+$ type semiconductor layer 1 is made such that it will increase toward the $P^+$ type semiconductor layer 1. FIG. 4 illustrates still another modification of this invention wherein the gradient of the concentration of the deep level impurities 4 in the N type intermediate layer 3 interposed between the $P^+$ type semiconductor layer 1 and the $N^+$ type semiconductor layer 2 is made larger towards the $P^+$ type and $N^+$ type semiconductor layers 1 and 2.

With semiconductor devices shown in FIGS. 3 and 4, it is also possible to obtain characteristic curves similar to that of the embodiment shown in FIG. 1.

Figure 5:
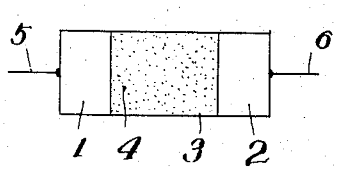
Figure 6:
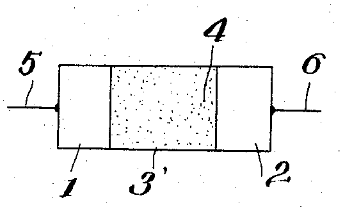
Figure 7:
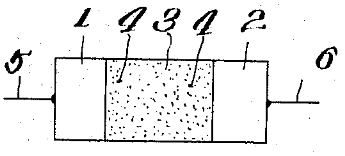

In still further embodiment illustrated in FIG. 5 to 7 inclusive, the semiconductor devices are of the $P^+PN^+$ junction type having an intermediate layer 3' of the P type, the gradient of the concentration of the deep level impurities 4 being similarly varied as in the embodiments, shown by FIGS. 1, 3. The characteristic curves of these embodiments shown by FIGS. 5 to 7 inclusive also have negative resistance portions at certain values of the voltage and current as in the previous embodiments. In these figures like reference numerals indicate the same or similar parts as in FIG. 1.

In prior semiconductor diodes having negative resistance characteristics, it is not only possible to control the magnitude of the voltage $V_p$ on the characteristic curve shown in FIG. 2, or the point of transition from positive to negative resistance characteristics or vice versa, by controlling the width or length of the regions which are included in the intermediate layer of the PN junction and containing deep level impurities but also can decrease the life of minority carriers by doping deep level impurities, thus enabling to decrease the switching time when the semiconductor devices are utilized as the switching elements. Thus the semiconductor devices of this invention have wide field of application as the circuit element. It is very easy to distribute the impurities so as to provide the required concentration gradient by conventional technique, such as solid diffusion.

While the invention has been explained by describing particular embodiments thereof, it will be apparent that improvements and modifications may be made without departing from the scope of the invention as defined in the appended claims.

What is claimed is:

1. A negative resistance semiconductor device of the junction type comprising a $P^+$ type semiconductor layer, and $N^+$ type semiconductor layer and an intermediate layer of P or N type provided between said semiconductor layers, said intermediate layer being doped with deep level impurities such that the concentration of said impurities gradually decreases toward the central portion of said intermediate layer from the interface between said layer and one or both of said semiconductor layers, said deep level impurities being selected from the group consisting of gold, copper, iron, zinc and nickel when the intermediate layer comprises silicon and selected from the group consisting of gold, iron, copper, nickel and cobalt when the intermediate layer is germanium.

2. The semiconductor device according to claim 1 wherein said intermediate layer is of the N type, said intermediate layer adjacent to said N+ type semiconductor layer is doped with deep level impurities, and the concentration of said impurities are gradually decreased toward the central portion of said intermediate layer, said deep level impurities being selected from the group consisting of gold, copper, iron, zinc and nickel when the intermediate layer comprises silicon and selected from the group consisting of gold, iron, copper, nickel and cobalt when the intermediate layer is germanium.

3. The semiconductor device according to claim 2 wherein said intermediate layer adjacent to said P+ type semiconductor layer is doped with deep level impurities and the concentration of said impurities are gradually decreased toward the central portion of said intermediate layer, said deep level impurities being selected from the group consisting of gold, copper, iron, zinc and nickel when the intermediate layer comprises silicon and selected from the group consisting of gold, iron, copper, nickel and cobalt when the intermediate layer is germanium.

4. The semiconductor device according to claim 3 wherein opposite regions of said intermediate layer adjacent to said P+ type and N+ type semiconductor layers, respectively, are doped with deep level impurities and the concentration of said impurities in both of said regions are gradually decreased toward the central portion of said intermediate layer, said deep level impurities being selected from the group consisting of gold, copper, iron, zinc and nickel when the intermediate layer comprises silicon and selected from the group consisting of gold, iron, copper, nickel and cobalt when the intermediate layer is germanium.

5. The semiconductor device according to claim 4 wherein said intermediate layer is of the P type, said intermediate layer adjacent to said P+ type semiconductor layer is doped with deep level impurities and the concentration of said impurities are gradually decreased toward the central portion of said intermediate layer, said deep level impurities being selected from the group consisting of gold, copper, iron, zinc and nickel when the intermediate layer comprises silicon and selected from the group consisting of gold, iron, copper, nickel and cobalt when the intermediate layer is germanium.

6. The semiconductor device according to claim 5 wherein said intermediate layer adjacent to said N+ type semiconductor layer is doped with deep level impurities and the concentration of said impurities are gradually decreased toward the central portion of said intermediate layer, said deep level impurities being selected from the group consisting of gold, copper, iron, zinc and nickel when the intermediate layer comprises silicon and selected from the group consisting of gold, iron, copper, nickel and cobalt when the intermediate layer is germanium.

7. The semiconductor device according to claim 5 wherein opposite regions of said intermediate layer adjacent to said P+ and N+ semiconductor layers, respectively, are doped with deep level impurities and the concentration of said impurities in both of said regions are gradually decreased toward the central portion of said intermediate layer, said deep level impurities being selected from the group consisting of gold, copper, iron, zinc and nickel when the intermediate layer comprises silicon and selected from the group consisting of gold, iron, copper, nickel and cobalt when the intermediate layer is germanium.

References Cited

UNITED STATES PATENTS

| | | | |
|---|---|---|---|
| 2,889,652 | 8/1959 | Read | 333—80 |
| 2,919,389 | 12/1959 | Heywang et al. | 317—242 |
| 3,083,302 | 4/1963 | Rutz | 307—88.5 |
| 3,093,755 | 6/1963 | Haberecht et al. | 317—235 |
| 3,121,808 | 2/1964 | Kahng et al. | 307—88.5 |
| 3,187,193 | 6/1965 | Rappaport et al. | 307—88.5 |
| 3,201,664 | 8/1965 | Adam | 317—234 |
| 3,215,908 | 11/1965 | Morinace et al. | 317—235 |
| 3,228,811 | 1/1966 | McGibbon | 148—33 |

JOHN W. HUCKERT, *Primary Examiner.*

M. H. MEDLOW, *Assistant Examiner.*